United States Patent
Kajiwara et al.

(10) Patent No.: US 11,054,735 B2
(45) Date of Patent: Jul. 6, 2021

(54) MASK BLANK, PHASE SHIFT MASK, METHOD FOR MANUFACTURING PHASE SHIFT MASK, AND METHOD FOR MANUFACTURING SEMICONDUCTOR DEVICE

(71) Applicant: HOYA CORPORATION, Tokyo (JP)

(72) Inventors: Takenori Kajiwara, Tokyo (JP); Ryo Ohkubo, Tokyo (JP); Hiroaki Shishido, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 165 days.

(21) Appl. No.: 16/318,216

(22) PCT Filed: Jun. 22, 2017

(86) PCT No.: PCT/JP2017/023032
§ 371 (c)(1),
(2) Date: Jan. 16, 2019

(87) PCT Pub. No.: WO2018/016262
PCT Pub. Date: Jan. 25, 2018

(65) Prior Publication Data
US 2019/0163047 A1    May 30, 2019

(30) Foreign Application Priority Data
Jul. 19, 2016 (JP) .............................. JP2016-141222

(51) Int. Cl.
G03F 1/32 (2012.01)
G03F 1/74 (2012.01)
G03F 1/26 (2012.01)
G03F 1/80 (2012.01)
H01L 21/033 (2006.01)

(52) U.S. Cl.
CPC .............. *G03F 1/32* (2013.01); *G03F 1/26* (2013.01); *G03F 1/74* (2013.01); *G03F 1/80* (2013.01); *H01L 21/0337* (2013.01)

(58) Field of Classification Search
None
See application file for complete search history.

(56) References Cited

U.S. PATENT DOCUMENTS

| | | |
|---|---|---|
| 2003/0047691 A1 | 3/2003 | Musil et al. |
| 2013/0071777 A1 | 3/2013 | Nozawa et al. |
| 2013/0177841 A1 | 7/2013 | Sakai et al. |
| 2015/0338731 A1 | 11/2015 | Nozawa et al. |

FOREIGN PATENT DOCUMENTS

| | | |
|---|---|---|
| JP | 08-220731 A | 8/1996 |
| JP | 2010-217514 A | 9/2010 |
| JP | 2016-020949 A | 2/2016 |
| JP | 2016-020950 A | 2/2016 |
| KR | 20150107787 A | 9/2015 |
| WO | 2014/112457 A1 | 7/2014 |

OTHER PUBLICATIONS

English translation of JP 2016-020950 from Google Patents. Retrieved Feb. 14, 2021. (Year: 2016).*
English translation of KR 10-2015-0107787. Retrieved from KIPRIS (engpat.kipris.or.kr) dated Jun. 8, 2021. (Year: 2015).*
JP2018-528460, "Notification of Reasons for Refusal", dated Jan. 14, 2020, with Machine Translation.
International Search Report of PCT/JP2017/023032 dated Sep. 12, 2017 [PCT/ISA/210].
SG11201900415R, "Invitation to Respond to Written Opinion", dated May 12, 2020, 6 pages.
JP2016-020950, "Notification of Reasons for Refusal", dated Jan. 14, 2020, with Machine Translation.
JP2018-528460, "Notice of Reasons for Refusal" dated Aug. 6, 2019.
SG11201900415R, "Invitation to Respond to Written Opinion", dated Oct. 22, 2020, 6 pages.
TW106122976, "Office Action" with Machine Translation, dated Oct. 26, 2020, 17 pages.
KR10-2019-7000969, "Notification of Reasons for Refusal" with Machine Translation, dated Apr. 28, 2021, 17 pages.

* cited by examiner

*Primary Examiner* — Kathleen Duda
(74) *Attorney, Agent, or Firm* — Kilpatrick Townsend & Stockton LLP (57) ABSTRACT

A mask blank having fast repair rate of EB defect repair and high repair rate ratio to EB defect repair relative to a transparent substrate that includes a phase shift film on a transparent substrate, the phase shift film has a structure including three sets or more of a set of a stacked structure including a high transmitting layer and a low transmitting layer, the high transmitting layer and the low transmitting layer are made of a material consisting of silicon and nitrogen, or a material consisting of silicon, nitrogen, oxygen, and one or more elements selected from a metalloid element and a non-metallic element, the high transmitting layer includes 50 atom % or more nitrogen content and has a thickness of 12 nm or less, and the low transmitting layer includes less than 50 atom % nitrogen content and has a thickness less than the high transmitting layer.

23 Claims, 2 Drawing Sheets

MASK BLANK, PHASE SHIFT MASK, METHOD FOR MANUFACTURING PHASE SHIFT MASK, AND METHOD FOR MANUFACTURING SEMICONDUCTOR DEVICE

CROSS REFERENCE TO RELATED APPLICATIONS

This application is a National Stage of International Application No. PCT/JP2017/023032, filed Jun. 22, 2017, claiming priority based on Japanese Patent Application No. 2016-141222, filed Jul. 19, 2016.

TECHNICAL FIELD

This invention relates to a mask blank, a phase shift mask manufactured using the mask blank, and a method for their manufacture. This invention further relates to a method for manufacturing a semiconductor device using the phase shift mask.

BACKGROUND ART

In a manufacturing process of a semiconductor device, photolithography is used to form a fine pattern. Multiple transfer masks are usually utilized in forming the fine pattern. In miniaturization of a semiconductor device pattern, it is necessary to shorten the wavelength of an exposure light source used in the photolithography, in addition to miniaturization of a mask pattern formed on the transfer mask. In recent years, application of an ArF excimer laser (wavelength 193 nm) is increasing as an exposure light source in the manufacture of semiconductor devices.

One type of a transfer mask is a half tone phase shift mask. Molybdenum silicide (MoSi)-based material is widely used for a phase shift film of the half tone phase shift mask. However, as disclosed in Publication 1, it has been discovered recently that the MoSi-based film has low durability to exposure light of an ArF excimer laser (so-called ArF light fastness). In Publication 1, ArF light fastness is enhanced by subjecting a MoSi-based film after formation of a pattern under plasma treatment, UV irradiation treatment, or heat treatment to form a passivation film on a surface of the pattern of the MoSi-based film.

Publication 2 discloses a phase shift mask including a SiNx phase shift film, and Publication 3 describes that a SiNx phase shift film was confirmed as having high ArF light fastness. On the other hand, Publication 4 discloses a defect repairing technique where xenon difluoride ($XeF_2$) gas is supplied to a black defect portion of a light shielding film while irradiating the part with an electron beam to etch and remove the black defect portion (defect repair by irradiating charged particles such as an electron beam as above is hereafter simply referred to as EB defect repair).

PRIOR ART PUBLICATIONS

Patent Publications

[Publication 1]
Japanese Patent Application Publication 2010-217514
[Publication 2]
Japanese Patent Application Publication 8-220731
[Publication 3]
Japanese Patent Application Publication 2014-137388
[Publication 4]
PCT Application Japanese Translation Publication 2004-537758

SUMMARY OF INVENTION

Problem to be Solved by the Invention

However, as disclosed in Publication 3, in the case of forming a phase shift film from a single layer structure of SiNx where an ArF excimer laser is applied as an exposure light, the following problem was discovered. In forming the SiNx film satisfying optical characteristics that are desired for the phase shift film by reactive sputtering, it was necessary to apply a film forming condition of transition mode that lacks stability. A phase shift film formed under the transition mode had a tendency to have low uniformity, both in-plane and in film thickness direction, in composition and optical characteristics.

For solving the above problem, Publication 3 employs a phase shift film of a stacked structure of a high transmitting layer made of a SiN-based material having a large amount of nitrogen content and a low transmitting layer made of a SiN-based material having a small amount of nitrogen content. Namely, the high transmitting layer is made of a SiN-based material having a large amount of nitrogen content by reactive sputtering under a film forming condition of poison mode (reaction mode), and the low transmitting layer is made of a SiN-based material having a small amount of nitrogen content by reactive sputtering under a film forming condition of metal mode. Such a phase shift film has high ArF light fastness, and has high uniformity, both in-plane and in film thickness direction, in composition and optical characteristics. Further, in the case where the phase shift film was formed on each of a plurality of substrates, uniformity in composition and optical characteristics is high among the plurality of phase shift films.

In the case where a black defect was detected in a thin film pattern in a mask defect inspection that is carried out in manufacturing a transfer mask from a mask blank, the black defect portion is repaired. In recent years, there is an increasing use of EB defect repair disclosed in Publication 4 for repairing the black defect portion. EB defect repair is a technique where unexcited fluorine-based gas such as $XeF_2$ is supplied to a black defect portion of a thin film pattern while irradiating the black defect portion with an electron beam so as to change the black defect portion into volatile fluoride for its removal.

In this EB defect repair, however, it is difficult to irradiate an electron beam only on the black defect portion, and it is also difficult to supply unexcited fluorine-based gas only to the black defect portion. When EB defect repair is performed, a surface of a transparent substrate near the black defect portion is relatively likely to be affected by the EB defect repair. Therefore, a sufficient repair rate ratio to EB defect repair is considered as necessary between the transparent substrate and the thin film pattern.

A phase shift film of a SiN-based material has a composition that is closer to a transparent substrate made of a glass material compared to a phase shift film of a MoSi-based material. Therefore, it is difficult to enhance repair rate ratio of a phase shift film of a SiN-based material relative to a transparent substrate to EB defect repair. Particularly, in the case where a phase shift film is a stacked structure of a low transmitting layer made of a SiN-based material with a small amount of nitrogen content and a high transmitting layer made of a SiN-based material of a large amount of nitrogen content, repair rate of EB defect repair of this phase shift film is slow, causing a problem of digging of a surface of the transparent substrate being likely to advance upon EB defect repair.

This invention was made to solve conventional problems. An object of the invention is to provide a mask blank having a phase shift film on a transparent substrate in which, even if a phase shift film is a stacked structure of a high transmitting layer made of a SiN-based material of a large amount of nitrogen content and a low transmitting layer made of a SiN-based material with a small amount of nitrogen content, repair rate of EB defect repair is sufficiently fast, and repair rate ratio relative to the transparent substrate to EB defect repair is sufficiently high. A further object of this invention is to provide a phase shift mask manufactured using the mask blank. Another object of this invention is to provide a method for manufacturing such a phase shift mask. Yet another object of this invention is to provide a method for manufacturing a semiconductor device using such a phase shift mask.

Means for Solving the Problem

For solving the above problem, this invention includes the following configurations.
(Configuration 1)
A mask blank comprising a phase shift film on a transparent substrate, wherein:
the phase shift film has a function to transmit an exposure light of an ArF excimer laser at a transmittance of 1% or more, and a function to generate a phase difference of 150 degrees or more and 200 degrees or less between the exposure light transmitted through the phase shift film and the exposure light transmitted through air for a same distance as a thickness of the phase shift film,
the phase shift film has a structure comprising three sets or more of a set of a stacked structure comprising a high transmitting layer and a low transmitting layer,
the high transmitting layer and the low transmitting layer are made of a material consisting of silicon and nitrogen, or a material consisting of silicon, nitrogen, and one or more elements selected from a metalloid element and a non-metallic element,
the high transmitting layer comprises 50 atom % or more nitrogen content and has a thickness of 11 nm or less, and
the low transmitting layer comprises less than 50 atom % nitrogen content and has a thickness less than the high transmitting layer.
(Configuration 2)
The mask blank according to Configuration 1, wherein the high transmitting layer and the low transmitting layer are made of same constituent elements.
(Configuration 3)
The mask blank according to Configuration 1 or 2, wherein the high transmitting layer and the low transmitting layer are made of a material consisting of silicon and nitrogen.
(Configuration 4)
The mask blank according to any one of Configurations 1 to 3, wherein the low transmitting layer has a thickness of ½ or less than a thickness of the high transmitting layer.
(Configuration 5)
The mask blank according to any one of Configurations 1 to 4, wherein the stacked structure has the high transmitting layer and the low transmitting layer stacked in this order from the transparent substrate side.
(Configuration 6)
The mask blank according to any one of Configurations 1 to 5, wherein the phase shift film has an uppermost layer at a position that is farthest from the transparent substrate, and the uppermost layer is made of a material consisting of silicon, nitrogen, and oxygen, or a material consisting of silicon, nitrogen, oxygen, and one or more elements selected from a metalloid element and a non-metallic element.
(Configuration 7)
The mask blank according to any one of Configurations 1 to 6 comprising a light shielding film on the phase shift film.
(Configuration 8)
A phase shift mask comprising a phase shift film having a transfer pattern on a transparent substrate, wherein:
the phase shift film has a function to transmit an exposure light of an ArF excimer laser at a transmittance of 1% or more, and a function to generate a phase difference of 150 degrees or more and 200 degrees or less between the exposure light transmitted through the phase shift film and the exposure light transmitted through air for a same distance as a thickness of the phase shift film,
the phase shift film has a structure comprising three sets or more of a set of a stacked structure comprising a high transmitting layer and a low transmitting layer,
the high transmitting layer and the low transmitting layer are made of a material consisting of silicon and nitrogen, or a material consisting of silicon, nitrogen, and one or more elements selected from a metalloid element and a non-metallic element,
the high transmitting layer comprises 50 atom % or more nitrogen content and has a thickness of 11 nm or less, and
the low transmitting layer comprises less than 50 atom % nitrogen content and has a thickness less than the high transmitting layer.
(Configuration 9)
The phase shift mask according to Configuration 8, wherein the high transmitting layer and the low transmitting layer made of same constituent elements.
(Configuration 10)
The phase shift mask according to Configuration 8 or 9, wherein the high transmitting layer and the low transmitting layer are made of a material consisting of silicon and nitrogen.
(Configuration 11)
The phase shift mask according to any one of Configurations 8 to 10, wherein the low transmitting layer has a thickness of ½ or less than a thickness of the high transmitting layer.
(Configuration 12)
The phase shift mask according to any one of Configurations 8 to 11, wherein the stacked structure has the high transmitting layer and the low transmitting layer stacked in this order from the transparent substrate side.
(Configuration 13)
The phase shift mask according to any one of Configurations 8 to 12, wherein the phase shift film has an uppermost layer at a position that is farthest from the transparent substrate, and the upper most layer is made of a material consisting of silicon, nitrogen, and oxygen, or a material consisting of silicon, nitrogen, oxygen, and one or more elements selected from a metalloid element and a non-metallic element.
(Configuration 14)
The phase shift mask according to any one of Configurations 8 to 13 comprising a light shielding film having a pattern comprising a light shielding band on the phase shift film.

(Configuration 15)

A method for manufacturing a phase shift mask using the mask blank according to Configuration 7, comprising the steps of:

forming a transfer pattern on the light shielding film by dry etching;

forming a transfer pattern on the phase shift film by dry etching with a light shielding film having the transfer pattern as a mask; and forming a pattern comprising a light shielding band on the light shielding film by dry etching with a resist film having a pattern comprising a light shielding band as a mask.

(Configuration 16)

A method for manufacturing a semiconductor device comprising the step of exposure-transferring a transfer pattern on a resist film on a semiconductor substrate using the phase shift mask according to Configuration 14.

(Configuration 17)

A method for manufacturing a semiconductor device comprising the step of exposure-transferring a transfer pattern on a resist film on a semiconductor substrate using a phase shift mask manufactured by the method for manufacturing a phase shift mask according to Configuration 15.

Effect of the Invention

In the mask blank of this invention, a phase shift film has a structure including three sets or more of a set of a stacked structure including a high transmitting layer and a low transmitting layer, the high transmitting layer and the low transmitting layer are made from a material consisting of silicon and nitrogen, or a material consisting of silicon, nitrogen, and one or more elements selected from a metalloid element and a non-metallic element, the high transmitting layer includes 50 atom % or more nitrogen content, has a thickness of 11 nm or less, the low transmitting layer includes less than 50 atom % nitrogen content, and has a thickness less than the high transmitting layer. With a mask blank having such a structure, ArF light fastness of the phase shift film can be enhanced while significantly accelerating repair rate of the phase shift film to EB defect repair, and repair rate ratio to EB defect repair of the phase shift film relative to a transparent substrate can be enhanced.

Further, the phase shift mask of this invention is featured in that a phase shift film having a transfer pattern has a structure similar to a phase shift film of a mask blank of this invention. With such a phase shift mask, high ArF light fastness of the phase shift film can be achieved and in addition, an excessive digging in a surface of the transparent substrate near a black defect can be inhibited even in the case where EB defect repair was made on a black defect portion of the phase shift film upon manufacturing the phase shift mask. Therefore, high transfer precision can be provided with the phase shift mask of this invention.

EMBODIMENTS FOR CARRYING OUT THE INVENTION

First, the proceeding that has resulted in the completion of this invention is described. The inventors of this invention made diligent studies on means to accelerate the repair rate of EB defect repair in the case where a phase shift film of a mask blank is made of a stacked structure of a high transmitting layer made of a SiN-based material with a large amount of nitrogen content (50 atom % or more nitrogen content) and a low transmitting layer made of a SiN-based material with a small amount of nitrogen content (less than 50 atom % nitrogen content) so that ArF light fastness is significantly increased.

Initially, repair rate of EB defect repair was measured for each of the high transmitting layer of a SiN-based material with a large amount of nitrogen content formed under a poison mode film forming condition and the low transmitting layer of a SiN-based material with a small amount of nitrogen content formed under a metal mode film forming condition. Concretely, only a SiN film with a large amount of nitrogen content was formed on a transparent substrate under a poison mode film forming condition, the SiN film was subjected to EB defect repair, and repair rate of the high transmitting layer was measured. Next, only a SiN film with a small amount of nitrogen content was formed on another transparent substrate under a metal mode film forming condition, the SiN film was subjected to EB defect repair, and repair rate of the low transmitting layer was measured. As a result, repair rate of the low transmitting layer made of a SiN-based material with a small amount of nitrogen content was found to be significantly faster than repair rate of the high transmitting layer made of a SiN-based material with a large amount of nitrogen content.

Next, a phase shift film with a structure of two layers, i.e., a high transmitting layer and a low transmitting layer, and a phase shift film including three sets of a combination of a high transmitting layer and a low transmitting layer (six-layer structure) were adjusted so that the film thickness of each layer has substantially the same transmittance and phase difference, and were formed respectively on two transparent substrates, each of the two phase shift films was subjected to EB defect repair, and repair rate of EB defect repair was measured, respectively. As a result, the six-layer structure phase shift film was found to have repair rate of EB defect repair that is obviously faster than the two-layer structure phase shift film.

There was almost no difference between the film thickness of the high transmitting layer of the two-layer structure phase shift film and the total film thickness of the three high transmitting layers of the six-layer structure phase shift film; and there was almost no difference between the film thickness of the low transmitting layer of the two-layer structure phase shift film and the total film thickness of the three low transmitting layers of the six-layer structure phase shift film. Therefore, there should have been almost no difference in repair rate of EB defect repair as calculated. Based on this result, a phase shift film of a structure provided with two sets of a combination of a high transmitting layer and a low transmitting layer (four-layer structure) which is adjusted so that the film thickness of each layer has substantially the same transmittance and phase difference as the two-layer structure and the six-layer structure phase shift films was formed on a transparent substrate, the phase shift film was subjected to EB defect repair, and repair rate of EB defect repair was measured. As a result, difference in repair rate of EB defect repair between the four-layer structure phase shift film and the two-layer structure phase shift film was significantly small, and the difference was not as conspicuous as that of the repair rate of EB defect repair between the six-layer structure phase shift film and the four-layer structure phase shift film.

There is almost no difference between the four-layer structure phase shift film and the six-layer structure phase shift film, except for the thickness of the high transmitting layer and the low transmitting layer. On a single layer of a high transmitting layer and a low transmitting layer, repair rate of EB defect repair of the low transmitting layer is significantly faster than the high transmitting layer. Further, since total film thickness of the low transmitting layer should be ½ or less than the total film thickness of the high transmitting layer to satisfy the transmittance and phase difference required for a phase shift film, it is unlikely that the thickness of the low transmitting layer is highly contributive. Difference in thickness of a high transmitting layer with slow repair rate of EB defect repair is considered as significantly contributing to the difference in repair rate of EB defect repair between the four-layer structure phase shift film and the six-layer structure phase shift film.

As a result of further diligent study, the inventors of this invention reached a conclusion that repair rate of EB defect repair can be significantly accelerated by forming a phase shift film including a structure provided with three or more sets of a combination of a high transmitting layer and a low transmitting layer, the low transmitting layer having a thickness less than the thickness of the high transmitting layer, and the high transmitting layer having a thickness of 11 nm or less. Namely, the mask blank of this invention is a mask blank having a phase shift film on a transparent substrate, in which the phase shift film has a function to transmit an exposure light of an ArF excimer laser at a transmittance of 1% or more and a function to generate a phase difference of 150 degrees or more and 200 degrees or less between the exposure light transmitted through the phase shift film and the exposure light transmitted through air for a same distance as a thickness of the phase shift film, the phase shift film has a structure including three sets or more of a set of a stacked structure including a high transmitting layer and a low transmitting layer, the high transmitting layer and the low transmitting layer are made from a material consisting of silicon and nitrogen, or a material consisting of silicon, nitrogen, and one or more elements selected from a metalloid element and a non-metallic element, the high transmitting layer includes 50 atom % or more nitrogen content, has a thickness of 11 nm or less, the low transmitting layer includes less than 50 atom % nitrogen content and has a thickness less than the high transmitting layer.

The reason why repair rate of EB defect repair becomes faster with the phase shift film having the above structure was investigated, and can be inferred as follows. The inference is based on a mere prediction by the inventors of this invention as of the filing, which by no means limits the scope of this invention.

It is most preferable for a thin film for pattern formation on a mask blank including a phase shift film to have an amorphous structure. This is due to good pattern edge roughness to be achieved when a pattern is formed by etching, for example. In the case of a composition involving difficulty in forming the thin film into an amorphous structure, a mixed condition of an amorphous structure and a microcrystalline structure may be applied.

EB defect repair of a silicon-based material film uses a mechanism where fluorine in unexcited gas such as $XeF_2$ is adsorbed in a black defect portion, fluorine in the gas is isolated, and the fluorine generates fluoride of silicon with relatively low boiling points and is volatilized. In EB defect repair, an electron beam is irradiated on a thin film of a black defect portion so as to excite silicon in the black defect portion. This allows easier generation of fluoride than silicon other than the black defect portion, preferentially volatilizes silicon in the black defect portion, and the black defect can be removed. In the case of EB defect repair, silicon in a black defect portion being free of crystal structure, i.e., having an amorphous structure, tends to generate fluoride of silicon more easily, and the black defect portion can be removed more easily.

A low transmitting layer of a phase shift film has nitrogen content of less than 50 atom %, and is considered as having relatively larger ratio of silicon in the layer having an amorphous structure, compared to a high transmitting layer with 50 atom % or more nitrogen content. Therefore, even if the same silicon nitride-based material is used, the low transmitting layer is considered as having significantly fast repair rate of EB defect repair than the high transmitting layer. On the other hand, the high transmitting layer with 50 atom % or more nitrogen content has relatively larger rate of the silicon in the layer having a microcrystalline structure.

The six-layer structure phase shift film of this invention includes at least two high transmitting layers interposed between two low transmitting layers. The interposed high transmitting layers are formed by a sputtering method where sputtering particles are entered and deposited on a surface of a lower low transmitting layer. On this occasion, a mixed region that is significantly thin (about 0.1-2 nm) including a mixture of constituent elements of the low transmitting layer and constituent elements of the high transmitting layer is formed between the lower low transmitting layer and the high transmitting layer. The mixed region has higher ratio of silicon in the region having an amorphous structure than the high transmitting layer. Similarly, when the upper low transmitting layer is formed by the sputtering method with the high transmitting layer formed, a mixed region is formed between the high transmitting layer and the upper low transmitting layer as well. Since these mixed regions have higher ratio of silicon in the layer having an amorphous structure than the high transmitting layer, repair rate of EB defect repair is considered as faster than the high transmitting layer. The thickness of these mixed regions does not significantly change, even with changes in the thicknesses of the high transmitting layer and the low transmitting layer. Incidentally, these mixed regions become larger, though slightly, when the phase shift film is subjected to heat treatment or photoirradiation treatment to be described below.

In the case of a four-layer structure phase shift film, it is difficult to make the thickness of all high transmitting layers 11 nm or less due to optical restriction of the phase shift film. Further, in the case of a four-layer structure phase shift film, since the number of the low transmitting layer contacting the high transmitting layer is less than the six-layer structure phase shift film, the number of formation of the mixed region is small. Thickness of the high transmitting layer per layer excluding the mixed region is significantly thicker in the four-layer structure phase shift film compared to the six-layer structure phase shift film. On the other hand, the thickness of the high transmitting layer of the six-layer structure phase shift film excluding the mixed region is less than 11 nm. Therefore, the time for removing one high transmitting layer by EB defect repair will be significantly shorter in the six-layer structure phase shift film than the four-layer structure phase shift film. For the above reason, significant acceleration of repair rate of EB defect repair is inferred as caused by forming a phase shift film to include a structure including three or more sets of a combination of a high transmitting layer and a low transmitting layer, the low transmitting layer being thinner than the high transmitting layer, and further, the high transmitting layer having a thickness of 11 nm or less.

Figure 1:
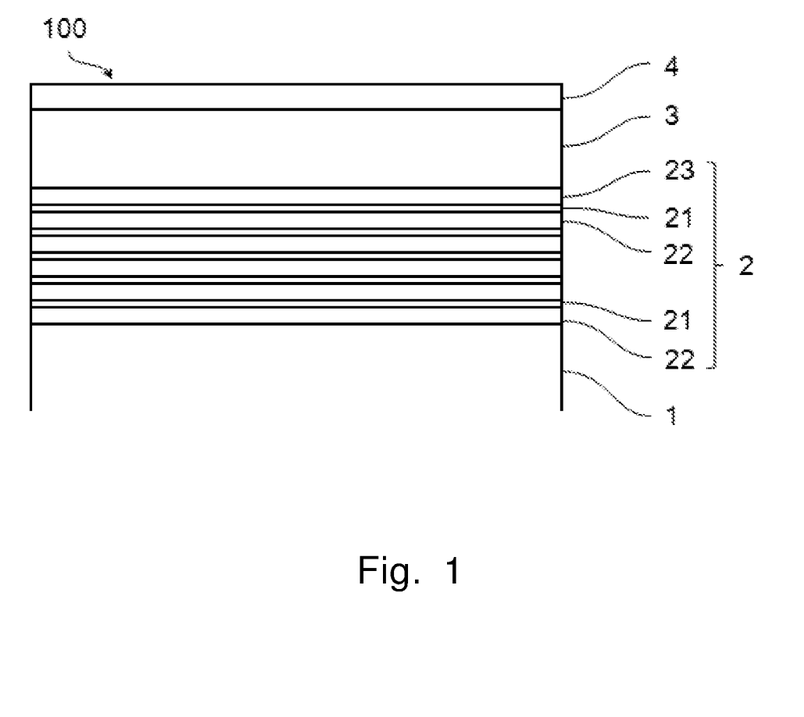
FIG. 1 is a cross-sectional view showing the structure of a mask blank of an embodiment of this invention.

Next, each embodiment of this invention is explained. FIG. 1 is a cross-sectional view showing a structure of a mask blank 100 according to an embodiment of this invention. The mask blank 100 shown in FIG. 1 has a structure where a transparent substrate 1 has a phase shift film 2, a light shielding film 3, and a hard mask film 4 stacked thereon in this order.

The transparent substrate 1 can be made from quartz glass, aluminosilicate glass, soda-lime glass, low thermal expansion glass ($SiO_2$—$TiO_2$ glass, etc.), etc., in addition to synthetic quartz glass. Among these materials, synthetic quartz glass has high transmittance to ArF excimer laser light (wavelength: about 193 nm), which is particularly preferable as a material for forming a transparent substrate of a mask blank.

To exhibit effective phase shifting effect, the phase shift film 2 has a transmittance to ArF excimer laser exposure light (hereafter referred to as ArF exposure light) of preferably 1% or more, and more preferably, 2% or more. Further, the phase shift film 2 is preferably adjusted so that the transmittance to ArF exposure light is 30% or less, more preferably 20% or less, and even more preferably 18% or less.

To obtain a proper phase shift effect, the phase shift film 2 is desired to have a function to generate a predetermined phase difference between the transmitting ArF exposure light and the light that transmitted through the air for the same distance as a thickness of the phase shift film 2. It is preferable that the phase difference is adjusted within the range of 150 degrees or more and 200 degrees or less. The lower limit of the phase difference of the phase shift film 2 is preferably 160 degrees or more, and more preferably 170 degrees or more. On the other hand, the upper limit of the phase difference of the phase shift film 2 is preferably 180 degrees or less, and more preferably 179 degrees or less. This is for the purpose of reducing an influence of increase in phase difference caused by microscopic etching of the transparent substrate 1 upon dry etching in forming a pattern on the phase shift film 2. This is also because, of the irradiation modes of ArF exposure light to phase shift masks by exposure apparatuses, the mode in which ArF exposure light enters from a direction that is oblique at a predetermined angle to a vertical direction of a film surface of the phase shift film 2 is increasingly used recently.

The phase shift film 2 of this invention at least includes a structure including three sets or more of a set of a stacked structure including a high transmitting layer 22 and a low transmitting layer 21 (six-layer structure). The phase shift film 2 in FIG. 1 includes five sets of stacked structures, each set including the high transmitting layer 22 and the low transmitting layer 21. This phase shift film 2 has a structure including five sets of stacked structure, each set including the high transmitting layer 22 and the low transmitting layer 21 stacked in this order from the side of the transparent substrate 1, and an uppermost layer 23 is further stacked on the topmost layer of the low transmitting layer 21.

The high transmitting layer 22 and the low transmitting layer 21 are made of a material consisting of silicon and nitrogen, or a material consisting of silicon, nitrogen, and one or more elements selected from a metalloid element and a non-metallic element. The low transmitting layer 21 and the high transmitting layer 22 do not contain transition metal that may cause reduction of light fastness to ArF exposure light. It is preferable that the high transmitting layer 22 and the low transmitting layer 21 are also free of metal elements excluding transition metal, since possibility of causing reduction of light fastness to ArF exposure light cannot be denied. The high transmitting layer 22 and the low transmitting layer 21 can contain any metalloid elements in addition to silicon. Among these metalloid elements, it is preferable to include one or more elements selected from boron, germanium, antimony, and tellurium, since enhancement in conductivity of silicon to be used as a sputtering target can be expected.

The high transmitting layer 22 and the low transmitting layer 21 can include any non-metallic elements in addition to nitrogen. The non-metallic elements in this invention refer to those including non-metallic elements in a narrow sense (nitrogen, carbon, oxygen, phosphorus, sulfur, selenium), halogen, and noble gas. Among the non-metallic elements, it is preferable to include one or more elements selected from carbon, fluorine, and hydrogen. In the high transmitting layer 22 and the low transmitting layer 21, it is preferable that oxygen content is reduced to 10 atom % or less, more preferably 5 atom % or less, and further preferable not to positively include oxygen (lower detection limit or less when composition analysis was conducted by X-ray photoelectron spectroscopy, etc.). Extinction coefficient k tends to significantly decrease when a silicon nitride-based material film contains oxygen, causing increase in overall thickness of the phase shift film 2. Incidentally, total content of silicon and nitrogen of the high transmitting layer 22 and the low transmitting layer 21 is preferably greater than 90 atom %, more preferably 95 atom % or more, and even more preferably 98 atom % or more.

A transparent substrate is generally made from a material containing $SiO_2$ such as synthetic quartz glass as a main component. In the case where any one of the high transmitting layer 22 and the low transmitting layer 21 is formed in contact with a surface of the transparent substrate 1 and if the layer contains oxygen, difference between the composition of the silicon nitride-based material film containing oxygen and the glass composition becomes small, which may cause a problem where, in dry etching using fluorine-based gas conducted in forming a pattern on the phase shift film 2, it will be difficult to obtain an etching selectivity between the layer in contact with the transparent substrate 1 (high transmitting layer 22 or low transmitting layer 21) and the transparent substrate 1.

The high transmitting layer 22 and the low transmitting layer 21 can contain noble gas. Noble gas is an element which, when present in a film forming chamber in forming a thin film by reactive sputtering, can increase deposition rate to enhance productivity. The noble gas is plasmarized and collided on the target so that target constituent elements eject out from the target, and while incorporating reactive gas on the way, are stacked on the transparent substrate 1 to form a thin film. While the target constituent elements eject out from the target until adhered on the transparent substrate, a small amount of noble gas in the film forming chamber is incorporated. Preferable noble gas required for the reactive sputtering includes argon, krypton, and xenon. Further, to mitigate stress of the thin film, neon and helium having small atomic weight can be positively incorporated into the thin film.

The high transmitting layer 22 is required have nitrogen content of 50 atom % or more. A silicon-based film has an extremely small refractive index n to ArF exposure light, and has large extinction coefficient k to ArF exposure light (hereafter, a simple refractive index n refers to refractive index n to ArF exposure light; simple extinction coefficient k refers to extinction coefficient k to ArF exposure light). As nitrogen content in the silicon-based film increases, refractive index n tends to increase and extinction coefficient k tends to decrease. To secure the transmittance required in the phase shift film 2 and also to secure the phase difference required in less thickness, the high transmitting layer 22 preferably has 50 atom % or more nitrogen content. The high transmitting layer 22 preferably has 52 atom % or more nitrogen content. Further, the high transmitting layer 22 preferably has 57 atom % or less nitrogen content, and more preferably, 55 atom % or less.

The low transmitting layer 21 is required to have nitrogen content of less than 50 atom %. The low transmitting layer 21 preferably has nitrogen content of 48 atom % or less, and more preferably, 45 atom % or less. Further, the low transmitting layer 21 preferably has nitrogen content of 20 atom % or more, and more preferably, 25 atom % or more. To secure the transmittance required in the phase shift film 2 and also to secure the phase difference required in less thickness, the low transmitting layer 21 preferably has nitrogen content of 20 atom % or more.

The high transmitting layer 22 and the low transmitting layer 21 are preferably made of the same constituent elements. In the case where any of the high transmitting layer 22 and the low transmitting layer 21 includes a different constituent element and heat treatment or photoirradiation treatment was conducted or ArF exposure light was irradiated while the layers are stacked in contact with each other, the different constituent element may migrate and disperse to the layer free of the constituent element. This may cause significant change in the optical characteristics of the high transmitting layer 22 and the low transmitting layer 21 from the start of the film formation. Particularly, if the different constituent element is a metalloid element, it would be necessary to form the high transmitting layer 22 and the low transmitting layer 21 using different targets.

The high transmitting layer 22 and the low transmitting layer 21 are preferably made of a material consisting of silicon and nitrogen. Incidentally, noble gas is an element that is difficult to be detected even if the thin film is subjected to composition analysis such as RBS (Rutherford Back-Scattering Spectrometry) and XPS (X-ray Photoelectron Spectroscopy). Therefore, the material consisting of silicon and nitrogen can be regarded as including a material containing noble gas.

The high transmitting layer 22 is required to have a thickness of 11 nm or less. The high transmitting layer 22 having a thickness of 11 nm or less can accelerate repair rate of EB defect repair. The high transmitting layer 22 is required to have a thickness of 11 nm or less. Thickness of the high transmitting layer 22 is preferably 10 nm or less, and more preferably, 9 nm or less. On the other hand, thickness of the high transmitting layer 22 is preferably 3 nm or more, more preferably 4 nm or more, and even more preferably 5 nm or more. When the high transmitting layer 22 has a thickness of less than 3 nm, it would be necessary to form the low transmitting layer 21 to have less thickness than the above, as will be mentioned below. Such a thin low transmitting layer 21 will only include a mixed region, and may be unable to obtain optical characteristics desired for the low transmitting layer 21. Incidentally, the thickness of the high transmitting layer 22 herein includes the mixed region.

The low transmitting layer 21 is required to have a thickness less than the thickness of the high transmitting layer 22. If the low transmitting layer 21 has more thickness than the thickness of the high transmitting layer 22, desired transmittance and phase difference cannot be obtained from such a phase shift film 2. Thickness of the low transmitting layer 21 is preferably 9 nm or less, and more preferably, 8 nm or less. Thickness of the low transmitting layer 21 is preferably 2 nm or more, and more preferably, 3 nm or more.

Thickness of the low transmitting layer 21 is preferably ½ or less than the thickness of the high transmitting layer 22. The low transmitting layer 21 has smaller refractive index n to ArF exposure light than the high transmitting layer 22, and has large extinction coefficient k to ArF exposure light. Therefore, when the total film thickness of the low transmitting layer is greater than ½ of the total film thickness of the high transmitting layer, it will become difficult to adjust the phase shift film 2 to desired transmittance and phase difference.

The number of sets of the stacked structure including the high transmitting layer 22 and the low transmitting layer 21 of the phase shift film 2 is required to be three sets (total of 6 layers) or more. The number of sets of the stacked structure is preferably four sets (total of 8 layers) or more. Further, the number of sets of the stacked structure including the high transmitting layer 22 and the low transmitting layer 21 of the phase shift film 2 is preferably ten sets (total of 20 layers) or less, more preferably nine sets (total of 18 layers) or less, and even more preferably, eight sets (total of 16 layers) or less. When the phase shift film 2 having desired transmittance and phase difference is designed using ten sets or more stacked structure, the low transmitting layer 21 will have a thickness of less than 2 nm, and such a thin low transmitting layer 21 will include only a mixed region.

The high transmitting layer 22 has higher abundance ratio of a microcrystalline structure made of Si—N bond than the low transmitting layer 21. Further, the low transmitting layer 21 has higher abundance ratio of an amorphous structure of Si compared to the high transmitting layer 22. Therefore, the mixed region formed between the high transmitting layer 22 and the low transmitting layer 21 has higher abundance ratio of an amorphous structure of Si compared to the region of the high transmitting layer 22 excluding the mixed region. Further, the mixed region has lower abundance ratio of a microcrystalline structure made of Si—N bond compared to the region of the high transmitting layer 22 excluding the mixed region. The mixed region having such an internal structure has faster repair rate of EB defect repair than the high transmitting layer 22. Incidentally, the mixed region preferably has a thickness in the range of between 0.1 nm or more and 2 nm or less.

The high transmitting layer 22 and the low transmitting layer 21 in the phase shift film 2 are preferably of a structure where the layers are directly stacked in contact with each other without any interposing film. The structure including said contact allows formation of a mixed region between the high transmitting layer 22 and the low transmitting layer 21, so as to accelerate repair rate of the phase shift film 2 to EB defect repair. From the viewpoint of repair rate in EB defect repair, the order of stacking of the stacked structure including the high transmitting layer 22 and the low transmitting layer 21 from the transparent substrate 1 side can be in any order.

From the viewpoint of end point detection precision of EB defect repair on the phase shift film 2, the stacked structure including the high transmitting layer 22 and the low transmitting layer 21 is preferably stacked in the order of the high transmitting layer 22 and the low transmitting layer 21 from the transparent substrate 1 side.

In EB defect repair, when an electron beam is irradiated on a black defect, at least one of Auger electron, secondary electron, characteristic X-ray, and backscattered electron discharged from the irradiated portion is detected and its change is observed to detect an endpoint of repair. For example, in the case of detecting Auger electrons discharged from the portion irradiated with electron beam, change of material composition is mainly observed by Auger electron spectroscopy (AES). In the case of detecting secondary electrons, change of surface shape is mainly observed from SEM image. In the case of detecting characteristic X-ray, change of material composition is mainly observed by energy dispersive X-ray spectrometry (EDX) or wavelength-dispersive X-ray spectrometry (WDX). In the case of detecting backscattered electrons, change of material composition and crystal state is mainly observed by electron beam backscatter diffraction (EBSD).

The transparent substrate 1 is made of a material including silicon oxide as a main component. End point detection between the phase shift film 2 and the transparent substrate 1 in the case of conducting EB defect repair on the phase shift film 2 made of a silicon nitride-based material is determined under the change from reduction of detection intensity of nitrogen to increase of detection intensity of oxygen upon progress of repair. Considering this point, it is more advantageous for end point detection of EB defect repair to arrange the high transmitting layer 22 with a large amount of nitrogen content on the layer of the phase shift film 2 in contact with the transparent substrate 1.

On the other hand, in forming a pattern on the phase shift film 2 of a silicon nitride-based material by dry etching, fluorine-based gas is generally used which has relatively small etching rate of dry etching to the transparent substrate 1 such as $SF_6$. In dry etching using fluorine-based gas such as $SF_6$, the low transmitting layer 21 with a small amount of nitrogen content can achieve higher etching selectivity between the transparent substrate 1. From the viewpoint of dry etching on the phase shift film 2, the stacked structure including the high transmitting layer 22 and the low transmitting layer 21 is preferably stacked in the order of the low transmitting layer 21 and the high transmitting layer 22 from the transparent substrate 1 side.

The high transmitting layer 22 is preferably made of a material where refractive index n to ArF exposure light is 2.5 or more (preferably 2.6 or more) and extinction coefficient k is less than 1.0 (preferably 0.9 or less, more preferably 0.7 or less, further preferably 0.5 or less). Further, the low transmitting layer 21 is preferably made of a material where refractive index n is less than 2.5 (preferably 2.4 or less, more preferably 2.2 or less) and extinction coefficient k is 1.0 or more (preferably 1.1 or more, more preferably 1.4 or more). This is because, in the case where the phase shift film 2 was formed with a stacked structure with six layers or more, it is difficult to satisfy predetermined phase difference and predetermined transmittance to ArF exposure light which are optical characteristics required as the phase shift film 2, unless the high transmitting layer 22 and the low transmitting layer 21 each has refractive index n and extinction coefficient k within the above range.

Refractive index n and extinction coefficient k of a thin film are not determined only by the composition of the thin film. Film density and crystal condition of the thin film are also the factors that affect refractive index n and extinction coefficient k. Therefore, various conditions in forming the thin film by reactive sputtering are adjusted so that the thin film achieves desired refractive index n and extinction coefficient k. For allowing the high transmitting layer 22 and low transmitting layer 21 to have refractive index n and extinction coefficient k of the above range, not only the ratio between noble gas and reactive gas composing mixed gas is adjusted in forming a film by reactive sputtering, but various other adjustments are made upon forming a film by reactive sputtering, such as pressure in a film forming chamber, power applied to the target, and positional relationship such as distance between the target and the transparent substrate. Further, these film forming conditions are unique to film forming apparatuses which are adjusted arbitrarily so that the thin film to be formed reaches desired refractive index n and extinction coefficient k.

While the high transmitting layer 22 and the low transmitting layer 21 are formed by sputtering, any sputtering method is applicable such as DC sputtering, RF sputtering, and ion beam sputtering. In the case where the target has low conductivity (silicon target, silicon compound target free of or including little amount of metalloid element, etc.), application of RF sputtering and ion beam sputtering is preferable. However, application of RF sputtering is more preferable, considering deposition rate.

The method for manufacturing the mask blank 100 preferably includes a high transmitting layer forming step of forming the high transmitting layer 22 on the transparent substrate 1 by reactive sputtering using a silicon target or a target consisting of silicon and one or more elements selected from a metalloid element and a non-metallic element in sputtering gas including nitrogen-based gas and noble gas; and a low transmitting layer forming step of forming the low transmitting layer 21 on the transparent substrate 1 by reactive sputtering using a silicon target or a target consisting of silicon and one or more elements selected from a metalloid element and a non-metallic element in sputtering gas including nitrogen-based gas and noble gas which has low mixing ratio of nitrogen-based gas than the high transmitting layer forming step.

Further, in the method for manufacturing the mask blank 100, it is preferable that sputtering gas used in the high transmitting layer forming step is selected to have a mixing ratio of nitrogen gas that is more than the range of mixing ratio of nitrogen gas of a transition mode in which film formation tends to be unstable, i.e., poison mode (reaction mode), and sputtering gas used in the low transmitting layer forming step is selected to have a mixing ratio of nitrogen-based gas that is less than the range of mixing ratio of nitrogen-based gas of a transition mode, i.e., metal mode. Incidentally, matters regarding poison mode (reaction mode), transition mode, and metal mode are similar to the case of forming the high transmitting layer and the low transmitting layer of the phase shift film by sputtering described in Publication 3.

Nitrogen-based gas used in the high transmitting layer forming step and the low transmitting layer forming step can be any gas as long as the gas contains nitrogen. As mentioned above, since it is preferable that the high transmitting layer 22 and the low transmitting layer 21 have less oxygen content, it is preferable to apply nitrogen-based gas free of oxygen, and it is preferable to apply nitrogen gas ($N_2$ gas). Further, any noble gas can be used for the high transmitting layer forming step and the low transmitting layer forming step. Preferable noble gas includes argon, krypton, and xenon. Further, to mitigate stress of the thin film, neon and helium having small atomic weight can be positively incorporated into the thin film.

The phase shift film 2 is preferably provided with an uppermost layer 23 at a position farthest from the transparent substrate 1 and which is made of a material consisting of silicon, nitrogen, and oxygen, or a material consisting of silicon, nitrogen, oxygen, and one or more elements selected from a metalloid element and a non-metallic element. A silicon-based material film that does not positively contain oxygen but contains nitrogen has high light fastness to ArF exposure light; however, it tends to have less chemical resistance compared to a silicon-based material film that positively contains oxygen. Further, in the case of a mask blank 100 where the high transmitting layer 22 or the low transmitting layer 21 that does not positively contain oxygen and which contains nitrogen is arranged as the uppermost layer 23 at an opposite side to the transparent substrate 1 of the phase shift film 2, it is difficult to avoid oxidization of the surface layer of the phase shift film 2 by subjecting the phase shift mask 200 manufactured from the mask blank 100 to mask cleaning and storage in the atmosphere. When a surface layer of the phase shift film 2 is oxidized, the optical characteristics change significantly from those as of the thin film formation. Particularly, in the case of a structure where the low transmitting layer 21 is provided as the uppermost layer 23 of the phase shift film 2, there will be a significant increase of transmittance due to oxidization of the low transmitting layer 21. By further providing the phase shift film 2 with the uppermost layer 23 on the stacked structure of the high transmitting layer 22 and the low transmitting layer 21, which is made of a material consisting of silicon, nitrogen, and oxygen or a material consisting of silicon, nitrogen, oxygen, and one or more elements selected from a metalloid element and non-metallic element, surface oxidization of the high transmitting layer 22 and the low transmitting layer 21 can be inhibited.

The uppermost layer 23 made of a material consisting of silicon, nitrogen, and oxygen, or a material consisting of silicon, nitrogen, oxygen, and one or more elements selected from a metalloid element and a non-metallic element includes a structure having substantially the same composition in layer thickness direction, and also includes a constitution with composition gradient in layer thickness direction (constitution with a composition gradient where oxygen content in the layer increases as the uppermost layer 23 is farther from the transparent substrate 1). Preferable materials for the uppermost layer 23 with the structure having substantially the same composition in layer thickness direction include $SiO_2$ and SiON. As for the uppermost layer 23 of the constitution with composition gradient in layer thickness direction, a preferable structure is that the transparent substrate 1 side is SiN, oxygen content increasing as going farther from the transparent substrate 1, and the surface layer is $SiO_2$ or SiON.

While the uppermost layer 23 is formed by sputtering, any sputtering method is applicable such as DC sputtering, RF sputtering, and ion beam sputtering. In the case where the target has low conductivity (silicon target, silicon compound target free of or including little amount of metalloid element, etc.), application of RF sputtering and ion beam sputtering is preferable. However, application of RF sputtering is more preferable, considering deposition rate.

Further, the method for manufacturing the mask blank 100 preferably includes an uppermost layer forming step in which the uppermost layer 23 is formed at a position farthest from the transparent substrate 1 of the phase shift film 2 by sputtering in sputtering gas containing noble gas using a silicon target or a target consisting of silicon and one or more elements selected from a metalloid element and a non-metallic element. Moreover, the method for manufacturing the mask blank 100 further preferably includes an uppermost layer forming step in which the uppermost layer 23 is formed at a position farthest from the transparent substrate 1 of the phase shift film 2 by reactive sputtering in sputtering gas containing nitrogen gas and noble gas using a silicon target, and oxidizing at least a surface layer of the uppermost layer 23. The treatment of oxidizing the surface layer of the uppermost layer 23 in this case includes heat treatment in gas containing oxygen such as in the atmosphere, photoirradiation treatment such as a flash lamp in gas containing oxygen such as in the atmosphere, treatment of contacting ozone or oxygen plasma on the uppermost layer 23, etc.

In forming the uppermost layer 23, an uppermost layer forming step is applicable in which the formation is made by reactive sputtering in sputtering gas containing nitrogen gas, oxygen gas, and noble gas using a silicon target or a target consisting of silicon and one or more elements selected from a metalloid element and a non-metallic element. The uppermost layer forming step is applicable to any of the formation of the uppermost layer 23 with a structure having substantially the same composition and the uppermost layer 23 having a constitution with composition gradient in layer thickness direction. Further, in forming the uppermost layer 23, an uppermost layer forming step is applicable in which formation is made by sputtering in sputtering gas containing noble gas using a silicon dioxide ($SiO_2$) target or a target consisting of silicon dioxide ($SiO_2$) and one or more elements selected from a metalloid element and a non-metallic element. The uppermost layer forming step is applicable to any of the formation of the uppermost layer 23 with a structure having substantially the same composition and the uppermost layer 23 having a constitution with composition gradient in layer thickness direction.

The mask blank 100 preferably has a light shielding film 3 on the phase shift film 2. Generally in a phase shift mask 200 (see FIGS. 2(a) to 2(f)), an outer peripheral region of a region to which a transfer pattern is formed (transfer pattern forming region) is desired to secure a predetermined value or more optical density (OD) so that the resist film is not affected by an exposure light that transmitted through the outer peripheral region when a resist film on a semiconductor wafer is exposure-transferred using an exposure apparatus. Optical density in an outer peripheral region of the phase shift mask 200 is required to be at least more than 2.0. The phase shift film 2 has a function to transmit an exposure light at a predetermined transmittance as mentioned above, and it is difficult to secure the above optical density with the phase shift film 2 alone. Therefore, it is desired to stack the light shielding film 3 on the phase shift film 2 at the stage of manufacturing the mask blank 100 to secure an optical density liable to be lacking. With such a structure of the mask blank 100, the phase shift mask 200 securing the above optical density on the outer peripheral region can be manufactured by removing the light shielding film 3 of the region using the phase shift effect (basically transfer pattern forming region) during manufacture of the phase shift film 2. Incidentally, the mask blank 100 preferably has 2.5 or more optical density in the stacked structure of the phase shift film 2 and the light shielding film 3, and more preferably, 2.8 or more. Further, for reducing the film thickness of the light shielding film 3, the stacked structure of the phase shift film 2 and the light shielding film 3 preferably has an optical density of 4.0 or less.

A single layer structure and a stacked structure of two or more layers are applicable to the light shielding film 3. Further, each layer in the light shielding film 3 of a single layer structure and the light shielding film 3 with a stacked structure of two or more layers can have a structure having substantially the same composition in layer thickness direction, and a constitution with composition gradient in layer thickness direction.

In the case where no film is interposed between the phase shift film 2 and the light shielding film 3, it is necessary for the light shielding film 3 to apply a material having sufficient etching selectivity to etching gas used in forming a pattern on the phase shift film 2. The light shielding film 3 in this case is preferably made of a material containing chromium. Materials containing chromium for forming the light shielding film 3 can include, in addition to chromium metal, a material containing chromium and one or more elements selected from oxygen, nitrogen, carbon, boron, and fluorine.

While a chromium-based material is generally etched by mixed gas of chlorine-based gas and oxygen gas, etching rate of the chromium metal to the etching gas is not as high. Considering enhancing etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among molybdenum and tin can be included in the material containing chromium for forming the light shielding film 3. Including one or more elements among molybdenum and tin can increase etching rate regarding mixed gas of chlorine-based gas and oxygen gas.

On the other hand, in the mask blank 100, in the case of a structure where another film is interposed between the light shielding film 3 and the phase shift film 2, it is preferable to form the another film (etching stopper and etching mask film) from the material containing chromium, and forming the light shielding film 3 from a material containing silicon. While the material containing chromium is etched by mixed gas of chlorine-based gas and oxygen gas, a resist film made from an organic material is likely to be etched by this mixed gas. A material containing silicon is generally etched by fluorine-based gas or chlorine-based gas. Since these etching gases are basically free of oxygen, film reduction amount of a resist film made of an organic material can be reduced more than etching with mixed gas of chlorine-based gas and oxygen gas. Therefore, film thickness of the resist film can be reduced.

A material containing silicon for forming the light shielding film 3 can include a transition metal. The material can also include metal elements other than the transition metal. The reason is that in the case where the phase shift mask 200 is manufactured from this mask blank 100, the pattern formed by the light shielding film 3 is basically a light shielding band pattern of an outer peripheral region having less accumulation of irradiation with ArF exposure light compared to a transfer pattern formation region, and the light shielding film 3 rarely remains in a fine pattern so that substantial problems hardly occur even if ArF light fastness is low. Another reason is that when a transition metal is included in the light shielding film 3, light shielding performance is significantly improved compared to the case without the transition metal, and the thickness of the light shielding film can be reduced. The transition metals to be included in the light shielding film 3 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or a metal alloy thereof.

On the other hand, a material consisting of silicon and nitrogen, or a material consisting of silicon, nitrogen, and one or more elements selected from a metalloid element and a non-metallic element is applicable as a material containing silicon for forming the light shielding film 3.

In the mask blank 100 having the light shielding film 3 stacked on the phase shift film 2, a preferable structure is that a hard mask film 4 made of a material having etching selectivity to etching gas used in etching the light shielding film 3 is further stacked on the light shielding film 3. Since the light shielding film 3 must have a function to secure a predetermined optical density, there is a limitation to reduce its thickness. The hard mask film 4 is only required to have a film thickness sufficient to function as an etching mask until the completion of dry etching for forming a pattern on the light shielding film 3 immediately below the hard mask film 4, and basically is not restricted optically. Therefore, the thickness of the hard mask film 4 can be reduced significantly compared to the thickness of the light shielding film 3. Since the resist film of an organic material is only required to have the film thickness sufficient to function as an etching mask until completion of dry etching for forming a pattern on the hard mask film 4, the thickness of the resist film can be reduced significantly more than before.

In the case where the light shielding film 3 is made of a material containing chromium, the hard mask film 4 is preferably made of the material containing silicon given above. Since the hard mask film 4 in this case tends to have low adhesiveness with the resist film of an organic material, it is preferable to treat the surface of the hard mask film 4 with HMDS (Hexamethyldisilazane) to enhance surface adhesiveness. The hard mask film 4 in this case is more preferably made of $SiO_2$, SiN, SiON, etc. Further, in the case where the light shielding film 3 is made of a material containing chromium, materials containing tantalum are also applicable as the materials of the hard mask film 4, in addition to the materials given above. The material containing tantalum in this case includes, in addition to tantalum metal, a material containing tantalum and one or more elements selected from nitrogen, oxygen, boron, and carbon, for example, Ta, TaN, TaON, TaBN, TaBON, TaCN, TaCON, TaBCN, and TaBOCN. Further, in the case where the light shielding film 3 is made of a material containing silicon, the hard mask film 4 is preferably made of the material containing chromium given above.

In the mask blank 100, an etching stopper film can be formed between the transparent substrate 1 and the phase shift film 2, which is made from a material having etching selectivity together with the transparent substrate 1 and the phase shift film 2 (the material containing chromium given above, e.g., Cr, CrN, CrC, CrO, CrON, CrC). Incidentally, this etching stopper film can be made of a material containing aluminum.

In the mask blank 100, a resist film of an organic material is preferably formed in contact with the surface of the hard mask film 4 at a film thickness of 100 nm or less. In the case of a fine pattern applicable to DRAM hp32 nm generation, a SRAF (Sub-Resolution Assist Feature) with 40 nm line width may be provided on a transfer pattern (phase shift pattern) to be formed on the hard mask film 4. However, even in this case, cross-sectional aspect ratio of the resist pattern can be reduced down to 1:2.5 so that collapse and peeling off of the resist pattern can be prevented in rinsing and developing, etc. of the resist film. The resist film preferably has a film thickness of 80 nm or less.

FIGS. 2(*a*) to 2(*f*) are schematic cross-sectional views showing the steps of manufacturing the phase shift mask 200 from the mask blank 100 of an embodiment of this invention.

The phase shift mask 200 of this invention is a phase shift mask including a phase shift film 2 (phase shift pattern 2*a*) having a transfer pattern on a transparent substrate 1, characterized in that the phase shift film 2 has a function to transmit an exposure light of an ArF excimer laser at a transmittance of 1% or more, and a function to generate a phase difference of 150 degrees or more and 200 degrees or less between the exposure light transmitted through the phase shift film 2 and the exposure light transmitted through air for the same distance as a thickness of the phase shift film 2, the phase shift film 2 has a structure including three sets or more of stacked structure, each set including a high transmitting layer 22 and a low transmitting layer 21, the high transmitting layer 22 and the low transmitting layer 21 are made from a material consisting of silicon and nitrogen, or a material consisting of silicon, nitrogen, and one or more elements selected from a metalloid element and a nonmetallic element, the high transmitting layer 22 includes 50 atom % or more nitrogen content, has a thickness of 11 nm or less, and the low transmitting layer 21 includes less than 50 atom % nitrogen content, and has a thickness less than the high transmitting layer 22.

This phase shift mask 200 has technical characteristics that are similar to the mask blank 100. The matters of the phase shift mask 200 regarding the transparent substrate 1, the high transmitting layer 22 and the low transmitting layer 21 of the phase shift film 2, and the light shielding film 3 are similar to the mask blank 100.

The method for manufacturing the phase shift mask 200 of this invention utilizes the mask blank 100, featured in including the steps of forming a transfer pattern on the light shielding film 3 by dry etching, forming a transfer pattern on the phase shift film 2 by dry etching with a light shielding film 3 (light shielding pattern 3a) having a transfer pattern as a mask, and forming a pattern (light shielding pattern 3b) including a light shielding band on the light shielding film 3 (light shielding pattern 3a) by dry etching with a resist film (resist pattern 6b) having a pattern including a light shielding band as a mask.

Such a phase shift mask 200 has high ArF light fastness, and change (increase) of CD (Critical Dimension) of the phase shift pattern 2a can be reduced down to a small range, even after the accumulated irradiation with exposure light of ArF excimer laser was made. In the case of manufacturing a phase shift mask 200 having a fine pattern applicable to the recent DRAM hp32 nm generation, the case in which there is no black defect portion at all at the stage where a transfer pattern was formed by dry etching on the phase shift film 2 of the mask blank 100 is extremely rare. Further, EB defect repair is often applied in a defect repair performed on a black defect portion of the phase shift film 2 having the fine pattern described above. The phase shift film 2 has fast repair rate to EB defect repair, and has high repair rate ratio to EB defect repair of the phase shift film 2 relative to the transparent substrate 1. Therefore, excessive digging of a surface of transparent substrate 1 on the black defect portion of the phase shift film 2 can be inhibited and the repaired phase shift mask 200 has high transfer precision.

For the above reason, when a phase shift mask 200 subjected to EB defect repair to a black defect portion and further subjected to accumulated irradiation is set on a mask stage of an exposure apparatus using ArF excimer laser as an exposure light and a phase shift pattern 2a is exposure-transferred on a resist film on a semiconductor substrate, a pattern can be transferred on the resist film on the semiconductor substrate at a precision that sufficiently satisfies the design specification.

One example of the method for manufacturing the phase shift mask 200 is explained below according to the manufacturing steps shown in FIGS. 2(*a*) to 2(*f*). In this example, a material containing chromium is used for the light shielding film 3, and a material containing silicon is used for the hard mask film 4.

Figure 2A:
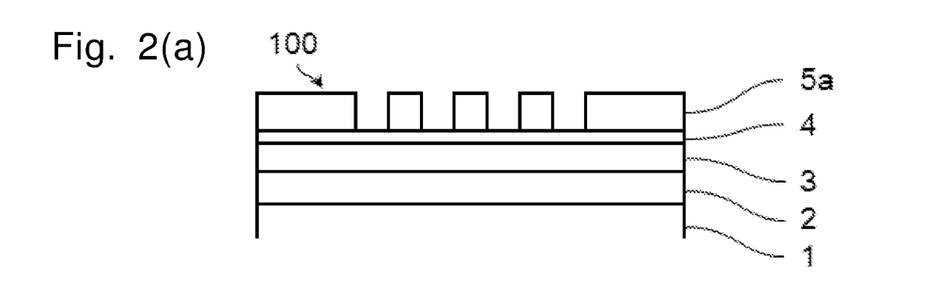
FIGS. 2(a) to 2(f) are cross-sectional views showing manufacturing steps of a phase shift mask of an embodiment of this invention.
Figure 2B:
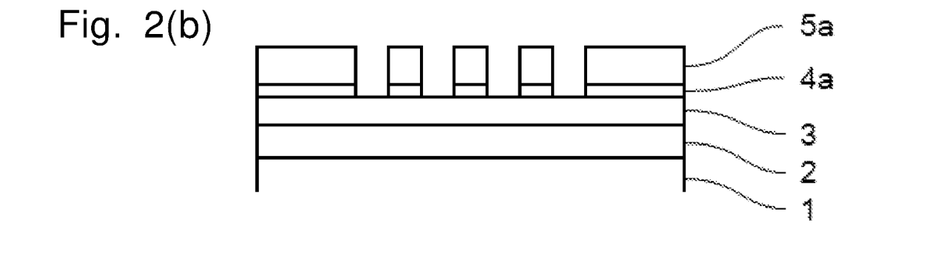
Figure 2C:
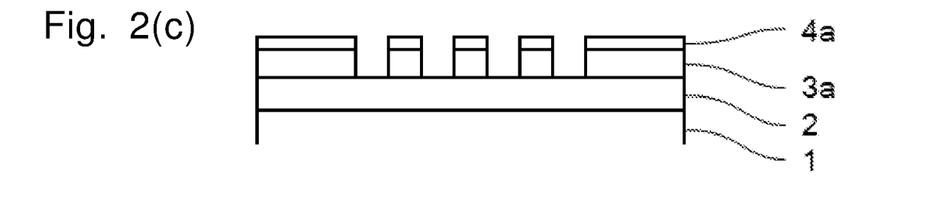

First, a resist film was formed in contact with the hard mask film 4 of the mask blank 100 by spin coating. Next, a first pattern, which is a transfer pattern (phase shift pattern) to be formed on the phase shift film, was exposed and written on the resist film, and routine treatments such as developing were further conducted, to thereby form a first resist pattern 5a having a phase shift pattern (see FIG. 2(*a*)). Subsequently, dry etching was conducted using fluorine-based gas with the first resist pattern 5a as a mask, and a first pattern (hard mask pattern 4a) was formed on the hard mask film 4 (see FIG. 2(*b*)).

Next, after removing the resist pattern 5a, dry etching was conducted using mixed gas of chlorine-based gas and oxygen gas with the hard mask pattern 4a as a mask, and a first pattern (light shielding pattern 3a) was formed on the light shielding film 3 (see FIG. 2(*c*)). Subsequently, dry etching was conducted using fluorine-based gas with the light shielding pattern 3a as a mask, and a first pattern (phase shift pattern 2a) was formed on the phase shift film 2, and at the same time the hard mask pattern 4a was removed (see FIG. 2(*d*)).

Next, a resist film was formed on the mask blank 100 by spin coating. Then, a second pattern, which is a pattern (light shielding pattern) to be formed on the light shielding film 3, was exposed and written on the resist film, and routine treatments such as developing were conducted, to thereby form a second resist pattern 6b having a light shielding pattern. Subsequently, dry etching was conducted using mixed gas of chlorine-based gas and oxygen gas with the second resist pattern 6b as a mask, and a second pattern (light shielding pattern 3b) was formed on the light shielding film 3 (see FIG. 2(*e*)). Further, the second resist pattern 6b was removed, routine treatments such as cleaning were conducted, and the phase shift mask 200 was obtained (see FIG. 2(*f*)).

There is no particular restriction on chlorine-based gas to be used for the dry etching described above, as long as Cl is included. The chlorine-based gas includes, for example, $Cl_2$, $SiCl_2$, $CHCl_3$, $CH_2Cl_2$, $CCl_4$, and $BCl_3$. Further, there is no particular restriction on fluorine-based gas used for the dry etching described above, as long as F is included. The fluorine-based gas includes, for example, $CHF_3$, $CF_4$, $C_2F_6$, $C_4F_8$, and $SF_6$. Particularly, fluorine-based gas free of C can further reduce damage on the transparent substrate 1, for having a relatively low etching rate to the transparent substrate 1 of a glass material.

Moreover, the method for manufacturing a semiconductor device of this invention is featured in using the above-mentioned phase shift mask 200 or a phase shift mask 200 manufactured by using the above-mentioned mask blank 100, and exposure-transferring a pattern on a resist film on a semiconductor substrate. Since the phase shift mask 200 and the mask blank 100 of this invention exhibit the above effect, a pattern can be transferred on a resist film on a semiconductor substrate at a precision that sufficiently satisfies the design specification, when the phase shift mask 200 of this invention subjected to EB defect repair to a black defect portion and further subjected to accumulated irradiation with an exposure light of ArF excimer laser is set on a mask stage of an exposure apparatus using ArF excimer laser as an exposure light and a phase shift pattern 2a is exposure-transferred on a resist film on a semiconductor substrate. Therefore, in the case where a lower layer film is dry etched to form a circuit pattern using a pattern of this resist film as a mask, a highly precise circuit pattern without short-circuit of wiring and disconnection caused by insufficient precision can be formed.

EXAMPLES

The embodiments for carrying out this invention will be further explained concretely below by Examples.

Example 1

[Manufacture of Mask Blank]

A transparent substrate 1 made of a synthetic quartz glass with a size of a main surface of about 152 mm×about 152 mm and a thickness of about 6.25 mm was prepared. An end surface and the main surface of the transparent substrate 1 were polished to a predetermined surface roughness, and thereafter subjected to routine cleaning treatment and drying treatment.

Next, the transparent substrate 1 was placed in a single-wafer RF sputtering apparatus, and by reactive sputtering (RF sputtering) using a silicon (Si) target with mixed gas of krypton (Kr), helium (He), and nitrogen ($N_2$) (flow ratio Kr:He:$N_2$=1:10:3, pressure=0.09 Pa) as sputtering gas and with 2.8 kW electric power of RF power source, a high transmitting layer 22 made of silicon and nitrogen (Si:N=44 atom %:56 atom %) was formed on the transparent substrate 1 at a thickness of 8.0 nm. On a main surface of another transparent substrate, only a high transmitting layer 22 was formed under the same condition and optical characteristics of the high transmitting layer 22 were measured using a spectroscopic ellipsometer (M-2000D manufactured by J. A. Woollam), and refractive index n was 2.66 and extinction coefficient k was 0.36 at a wavelength of 193 nm.

Incidentally, with regard to the conditions used in forming the high transmitting layer 22, film forming conditions, such as flow ratio, that can stably form a film in the region of poison mode (reaction mode) were selected previously with the single-wafer RF sputtering apparatus to be used by verifying the relationship between flow ratio of $N_2$ gas in the mixed gas of Kr gas, He gas, and $N_2$ gas in the sputtering gas and deposition rate. Further, the composition of the high transmitting layer 22 was obtained as a result of measurement using an X-ray photoelectron spectroscopy (XPS). The same applies to other films hereafter.

Next, the transparent substrate 1 having the high transmitting layer 22 stacked thereon was placed in a single-wafer RF sputtering apparatus, and by reactive sputtering (RF sputtering) using a silicon (Si) target with mixed gas of krypton (Kr), helium (He), and nitrogen ($N_2$) (flow ratio Kr:He:$N_2$=1:10:1, pressure=0.035 Pa) as sputtering gas and with 2.8 kW electric power of RF power source, a low transmitting layer 21 made of silicon and nitrogen (Si:N=62 atom %:38 atom %) was formed on the high transmitting layer 22 at a thickness of 3.5 nm. In a different transparent substrate, only a low transmitting layer 21 was formed under the same condition on a main surface. Optical characteristics of the low transmitting layer 21 were measured using a spectroscopic ellipsometer (M-2000D manufactured by J. A. Woollam). Refractive index n was 2.10 and extinction coefficient k was 1.50 at a wavelength of 193 nm.

Incidentally, with regard to the conditions used in forming the low transmitting layer 21, film forming conditions such as flow ratio that can stably form a film in the region of metal mode were selected previously with the single-wafer RF sputtering apparatus to be used by verifying the relationship between flow ratio of $N_2$ gas in the mixed gas of Kr gas, He gas, and $N_2$ gas in the sputtering gas and deposition rate. Through the above procedure, one set of stacked structure was formed in contact with a surface of the transparent substrate 1, having the high transmitting layer 22 and the low transmitting layer 21 stacked in this order. Next, four sets of stacked structures, each set including the high transmitting layer 22 and the low transmitting layer 21, were further formed through the similar procedure in contact with a surface of the low transmitting layer 21 of the transparent substrate 1 including said one set of stacked structure formed thereon.

Next, a transparent substrate 1 having five sets of the stacked structure of the high transmitting layer 22 and the low transmitting layer 21 was placed in a single-wafer RF sputtering apparatus, and an uppermost layer 23 was formed in contact with a surface of the high transmitting layer 22 that is the farthest from the transparent substrate 1 side at a thickness of 8.0 nm under the same film forming conditions as in forming the high transmitting layer 22. Through the above procedure, a phase shift film 2 having a structure totaling eleven layers, which includes five sets of a stacked structure of the high transmitting layer 22 and the low transmitting layer 21, and having the uppermost layer 23 thereon, on the transparent substrate 1 was formed at a total film thickness of 65.5 nm.

Next, the transparent substrate 1 having the phase shift film 2 formed thereon was subjected to heat treatment under the condition of 500° C. heating temperature in the atmosphere for the processing time of one hour. Transmittance and phase difference of the phase shift film 2 after the heat treatment to wavelength of an ArF excimer laser light (about 193 nm) were measured using a phase shift measurement device (MPM-193 manufactured by Lasertec). The transmittance was 5.9% and the phase difference was 175.9 degrees.

On another transparent substrate 1, a phase shift film 2 after heat treatment was formed through the similar procedure, and the cross-section of the phase shift film 2 was observed using a TEM (Transmission Electron Microscopy). The uppermost layer 23 had a constitution with composition gradient where oxygen content increases as the distance of the uppermost layer from the transparent substrate 1 increases. Further, presence of a mixed region of about 1 nm was confirmed near each of the interfaces between the high transmitting layer 22 and the low transmitting layer 21.

Next, the transparent substrate 1 having the phase shift film 2 after the heat treatment formed thereon was placed in a single-wafer DC sputtering apparatus, and by reactive sputtering (DC sputtering) using a chromium (Cr) target, with mixed gas of argon (Ar), carbon dioxide ($CO_2$), nitrogen ($N_2$), and helium (He) (flow ratio Ar:$CO_2$:$N_2$:He=22:39:6:33, pressure=0.2 Pa) as sputtering gas, and with 1.9 kW electric power of DC power source, a lowermost layer of the light shielding film 3 made of CrOCN was formed in contact with a surface of the phase shift film 2 at a thickness of 30 nm.

Next, by reactive sputtering (DC sputtering) using the same chromium (Cr) target with mixed gas of argon (Ar) and nitrogen ($N_2$) (flow ratio Ar:$N_2$=83:17, pressure=0.1 Pa) as a sputtering gas, and with 1.4 kW electric power of DC power source, a lower layer of the light shielding film 3 made of CrN was formed on the lowermost layer of the light shielding film 3 at a thickness of 4 nm.

Next, by reactive sputtering (DC sputtering) using the same chromium (Cr) target, with mixed gas of argon (Ar), carbon dioxide ($CO_2$), nitrogen ($N_2$), and helium (He) (flow ratio Ar:$CO_2$:$N_2$:He=21:37:11:31, pressure=0.2 Pa) as sputtering gas, and with 1.9 kW electric power of DC power source, an upper layer of the light shielding film 3 made of CrOCN was formed on the lower layer of the light shielding film 3 at a thickness of 14 nm. Through the above procedure, a light shielding film 3 of a chromium-based material having a three-layer structure of, from the phase shift film 2 side, a lowermost layer made of CrOCN, a lower layer made of CrN, and an upper layer made of CrOCN was formed at a total film thickness of 48 nm.

Further, the transparent substrate 1 with the phase shift film 2 and the light shielding film 3 stacked thereon was placed in a single-wafer RF sputtering apparatus, and by RF sputtering using a silicon dioxide ($SiO_2$) target with argon (Ar) gas (pressure=0.03 Pa) as sputtering gas, and with 1.5 kW electric power of RF power source, a hard mask film 4 made of silicon and oxygen was formed on the light shielding film 3 at a thickness of 5 nm. Through the above procedure, the mask blank 100 was formed, having a structure where the eleven layer structure phase shift film 2, the light shielding film 3, and the hard mask film 4 are stacked on the transparent substrate 1.

[Manufacture of Phase Shift Mask]

Next, the phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed on the phase shift film 2, was written by an electron beam on the resist film, routine cleaning and developing treatments were conducted, and a first resist pattern 5a having the first pattern was formed (see FIG. 2(a)). At this stage, a programmed defect was added in addition to the phase shift pattern that is to be originally formed, so that a black defect is formed on the phase shift film 2.

Next, dry etching using $CF_4$ gas was conducted with the first resist pattern 5a as a mask, and a first pattern (hard mask pattern 4a) was formed on the hard mask film 4 (see FIG. 2(b)).

Subsequently, the first resist pattern 5a was removed. Next, dry etching was conducted using mixed gas of chlorine and oxygen (gas flow ratio $Cl_2:O_2$=4:1) with the hard mask pattern 4a as a mask, and a first pattern (light shielding pattern 3a) was formed on the light shielding film 3 (see FIG. 2(c)).

Figure 2D:
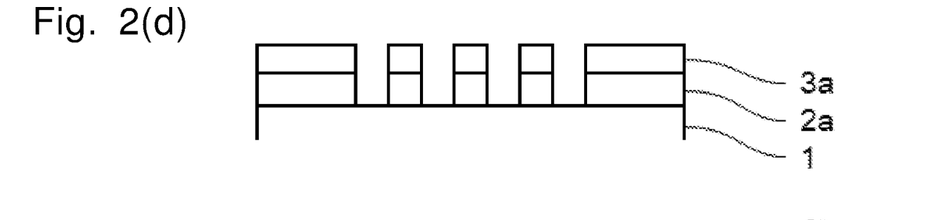
Figure 2E:
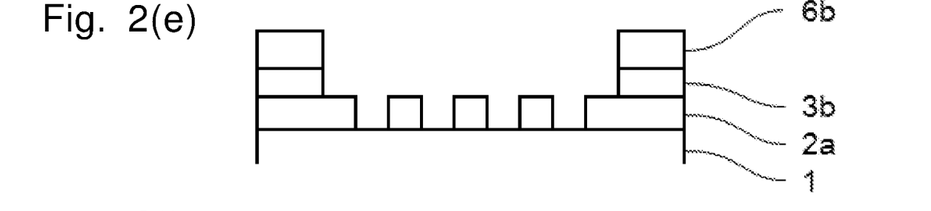
Figure 2F:
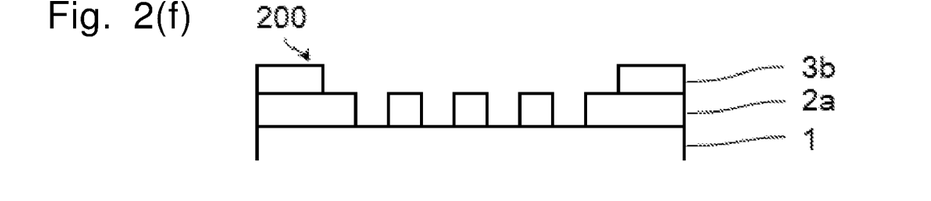

Next, dry etching was conducted using fluorine-based gas (mixed gas of $SF_6$ and He) with the light shielding pattern 3a as a mask, and a first pattern (phase shift pattern 2a) was formed on the phase shift film 2, and at the same time the hard mask pattern 4a was removed (see FIG. 2(d)).

Next, a resist film of a chemically amplified resist for electron beam writing was formed on the light shielding pattern 3a by spin coating at a film thickness of 150 nm. Next, a second pattern, which is a pattern (light shielding pattern) to be formed on the light shielding film 3, was exposed and written on the resist film, further subjected to routine treatments such as developing, and a second resist pattern 6b having a light shielding pattern was formed. Subsequently, dry etching was conducted with a mixed gas of chlorine and oxygen (gas flow ratio $Cl_2:O_2$=4:1) using the second resist pattern 6b as a mask, and a second pattern (light shielding pattern 3b) was formed on the light shielding film 3 (see FIG. 2(e)). Further, the second resist pattern 6b was removed, routine treatments such as cleaning were carried out, and the phase shift mask 200 was obtained (see FIG. 2(f)).

The manufactured half tone phase shift mask 200 of Example 1 was subjected to mask pattern inspection by a mask inspection apparatus, and the presence of a black defect was confirmed on the phase shift pattern 2a of a location where a programmed defect was arranged. The black defect portion was subjected to EB defect repair. Repair rate ratio of the phase shift pattern 2a relative to the transparent substrate 1 was as high as 4.1, and etching on the surface of the transparent substrate 1 can be minimized.

Next, the phase shift pattern 2a of the phase shift mask 200 of Example 1 after the EB defect repair was subjected to a treatment of irradiating an ArF excimer laser light at an accumulated irradiation amount of 20 $kJ/cm^2$. The amount of CD change of the phase shift pattern 2a before and after the irradiation treatment was about 2 nm, which was an amount of CD change within the range that can be used as the phase shift mask 200. A simulation of a transfer image was made when an exposure transfer was made on a resist film on a semiconductor substrate using AIMS193 (manufactured by Carl Zeiss) at an exposure light of wavelength 193 nm on the phase shift mask 200 of Example 1 after EB defect repair and irradiation treatment of ArF excimer laser light.

The exposure transfer image of this simulation was verified, and the design specification was sufficiently satisfied. Further, the transfer image of the portion subjected to EB defect repair was at a comparable level to the transfer images of other regions. It can be understood from this result that when the phase shift mask 200 of Example 1 after EB defect repair and accumulated irradiation with ArF excimer laser is set on a mask stage of an exposure apparatus and exposure-transferred on a resist film on a semiconductor substrate, a circuit pattern to be finally formed on the semiconductor substrate can be formed at a high precision.

Example 2

[Manufacture of Mask Blank]

The mask blank 100 of Example 2 was manufactured through the same procedure as the mask blank 100 of Example 1, except for the change of the phase shift film 2. Concretely, in the phase shift film 2 of Example 2, the high transmitting layer 22 with a thickness of 10.5 nm and the low transmitting layer 21 with a thickness of 2.5 nm were formed, and a total of four sets of the stacked structure of the high transmitting layer 22 and the low transmitting layer 21 were made, with the uppermost layer 23 having a thickness of 10.5 nm. Namely, a phase shift film 2 having a structure totaling nine layers including the transparent substrate 1 having formed thereon four sets of stacked structure of the high transmitting layer 22 and the low transmitting layer 21, and having the uppermost layer 23 formed thereon was formed at a total film thickness of 62.5 nm.

In the case of Example 2 as well, the transparent substrate 1 having the phase shift film 2 formed thereon was subjected to heat treatment under the condition of 500° C. heating temperature in the atmosphere for processing time of one hour. Transmittance and phase difference of the phase shift film 2 after the heat treatment to a light of an ArF excimer laser wavelength (about 193 nm) were measured using a phase shift measurement device (MPM-193 manufactured by Lasertec), and the transmittance was 12.1% and the phase difference was 174.2 degrees.

On another transparent substrate 1, a phase shift film 2 after heat treatment was formed through the similar procedure, and the cross-section of the phase shift film 2 was observed using a TEM. The uppermost layer 23 had a constitution with composition gradient where oxygen content increases as the distance of the uppermost layer 23 from the transparent substrate 1 increases. Further, presence of a mixed region of about 1 nm was confirmed near each of the interfaces between the high transmitting layer 22 and the low transmitting layer 21.

Through the above procedure, the mask blank 100 of Example 2 was manufactured, which includes a structure where the phase shift film 2 of the nine layer structure, the light shielding film 3, and the hard mask film 4 are stacked on the transparent substrate 1.

[Manufacture of Phase Shift Mask]

Next, using the mask blank 100 of Example 2, a phase shift mask 200 of Example 2 was manufactured through the same procedure as Example 1. The manufactured half tone phase shift mask 200 of Example 2 was subjected to mask pattern inspection by a mask inspection apparatus, and the presence of a black defect was confirmed on the phase shift pattern 2a of a location where a programmed defect was arranged. The black defect portion was subjected to EB defect repair. Repair rate ratio of the phase shift pattern 2a relative to the transparent substrate 1 was as high as 4.0, and etching on the surface of the transparent substrate 1 was minimized.

Next, the phase shift pattern 2a of the phase shift mask 200 of Example 2 after the EB defect repair was subjected to a treatment of irradiating an ArF excimer laser light at an accumulated irradiation amount of 20 kJ/cm$^2$. The amount of CD change of the phase shift pattern 2a before and after the irradiation treatment was about 2 nm, which was an amount of CD change within the range that can be used as the phase shift mask 200. A simulation of a transfer image was made when an exposure transfer was made on a resist film on a semiconductor substrate using AIMS193 (manufactured by Carl Zeiss) at an exposure light of wavelength 193 nm on the phase shift mask 200 of Example 2 after EB defect repair and irradiation treatment of ArF excimer laser light.

The exposure transfer image of this simulation was verified, and the design specification was sufficiently satisfied. Further, the transfer image of the portion subjected to EB defect repair was at a comparable level to the transfer images of other regions. It can be understood from this result that when the phase shift mask 200 of Example 2 after EB defect repair and accumulated irradiation with ArF excimer laser was set on a mask stage of an exposure apparatus and exposure-transferred on a resist film on a semiconductor substrate, a circuit pattern to be finally formed on the semiconductor substrate can be formed at a high precision.

Comparative Example 1

[Manufacture of Mask Blank]

The mask blank of Comparative Example 1 was manufactured through the same procedure as the mask blank 100 of Example 1, except for the change of the phase shift film. Concretely, the phase shift film of Comparative Example 1 was made as a two-layer structure by forming a low transmitting layer at a thickness of 12 nm in contact with a surface of the transparent substrate through the same procedure as Example 1 and forming a high transmitting layer at a thickness of 55 nm in contact with a surface of the low transmitting layer, with a total film thickness of 67 nm.

In the case of Comparative Example 1 as well, the transparent substrate having the phase shift film formed thereon was subjected to heat treatment under the condition of 500° C. heating temperature in the atmosphere for processing time of one hour. Transmittance and phase difference of the phase shift film after the heat treatment to wavelength of an ArF excimer laser light (about 193 nm) were measured using a phase shift measurement device (MPM-193 manufactured by Lasertec), and the transmittance was 5.97% and the phase difference was 177.7 degrees.

On another transparent substrate, a phase shift film after heat treatment was formed through the similar procedure, and the cross-section of the phase shift film was observed using a TEM. The high transmitting layer had a constitution with composition gradient where oxygen content increases as the distance of the high transmitting layer from the transparent substrate increases. Further, presence of a mixed region of about 1 nm was confirmed near the interface between the low transmitting layer and the high transmitting layer.

Through the above procedure, the mask blank of Comparative Example 1 was manufactured, which includes a structure where the two-layer structure phase shift film, the light shielding film, and the hard mask film are stacked on the transparent substrate.

[Manufacture of Phase Shift Mask]

Next, using the mask blank of Comparative Example 1, a phase shift mask of Comparative Example 1 was manufactured through the same procedures as Example 1. The manufactured half tone phase shift mask of Comparative Example 1 was subjected to a mask pattern inspection using a mask inspection apparatus, and presence of black defect was confirmed on the phase shift pattern at a section where a programmed defect was arranged. The black defect portion was subjected to EB defect repair, and repair rate ratio of the phase shift pattern relative to the transparent substrate was as low as 1.5, indicating an advancement of etching to the surface of the transparent substrate.

Next, the phase shift pattern of the phase shift mask of Comparative Example 1 after the EB defect repair was subjected to a treatment of irradiating an ArF excimer laser light at an accumulated irradiation amount of 20 kJ/cm$^2$. The amount of CD change of the phase shift pattern before and after the irradiation treatment was about 2 nm, which was an amount of CD change within the range that can be used as the phase shift mask. A simulation of a transfer image was made when an exposure transfer was made on a resist film on a semiconductor substrate using AIMS193 (manufactured by Carl Zeiss) at an exposure light of wavelength 193 nm on the phase shift mask 200 of Comparative Example 1 after EB defect repair and irradiation treatment of ArF excimer laser light.

The exposure transfer image of this simulation was verified, and the design specification was generally satisfied in portions other than those subjected to EB defect repair. However, the transfer image of the portion subjected to EB defect repair was at a level where a transfer defect will occur caused by influence on the transparent substrate by etching, etc. It can be understood from this result that when the phase shift mask of Comparative Example 1 after EB defect repair was set on a mask stage of an exposure apparatus and exposure-transferred on a resist film on a semiconductor substrate, generation of short-circuit or disconnection of circuit pattern is expected on a circuit pattern finally formed on the semiconductor substrate.

DESCRIPTION OF REFERENCE NUMERALS 1 transparent substrate
2 phase shift film 2a phase shift pattern
21 low transmitting layer
22 high transmitting layer
23 uppermost layer
3 light shielding film
3a,3b light shielding pattern
4 hard mask film
4a hard mask pattern
5a first resist pattern
6b second resist pattern
100 mask blank
200 phase shift mask

The invention claimed is:

1. A mask blank comprising a phase shift film on a transparent substrate, wherein:
the phase shift film has a function to transmit an exposure light of an ArF excimer laser at a transmittance of 1% or more, and a function to generate a phase difference of 150 degrees or more and 200 degrees or less between the exposure light transmitted through the phase shift film and the exposure light transmitted through air for a same distance as a thickness of the phase shift film,
the phase shift film has a structure where a high transmitting layer and a low transmitting layer are stacked alternately to form a total of six or more layers,
the high transmitting layer and the low transmitting layer are made of a material consisting essentially of silicon and nitrogen, or a material consisting essentially of silicon, nitrogen, and one or more elements selected from boron, germanium, antimony, tellurium, carbon, oxygen, phosphorus, sulfur, selenium, halogen and noble gas,
the high transmitting layer comprises 50 atom % or more nitrogen content and has a thickness of 11 nm or less, and
the low transmitting layer comprises less than 50 atom % nitrogen content and has a thickness less than the high transmitting layer, and
a mixed region including a mixture of constituent elements of the low transmittal layer and constituent elements of the high transmittal layer is formed between the low transmitting layer and the high transmitting layer.

2. The mask blank according to claim 1, wherein the high transmitting layer and the low transmitting layer are made of same constituent elements.

3. The mask blank according to claim 1, wherein the high transmitting layer and the low transmitting layer are made of a material consisting essentially of silicon and nitrogen.

4. The mask blank according to claim 1, wherein the low transmitting layer has a thickness of ½ or less than a thickness of the high transmitting layer.

5. The mask blank according to claim 1, wherein the stacked structure has the high transmitting layer and the low transmitting layer stacked in this order from the transparent substrate side.

6. The mask blank according to claim 1, wherein the phase shift film has an uppermost layer at a position that is farthest from the transparent substrate, and the uppermost layer is made of a material consisting essentially of silicon, nitrogen, and oxygen, and one or more elements selected from boron, germanium, antimony, tellurium, carbon, phosphorus, sulfur, selenium, halogen and noble gas.

7. The mask blank according to claim 1 comprising a light shielding film on the phase shift film.

8. The mask blank according to claim 1, wherein the mixed region has a thickness of 0.1 nm or more and 2 nm or less.

9. The mask blank according to claim 1, wherein the mixed region has higher abundance ratio of an amorphous structure of silicon compared to the high transmitting layer.

10. The mask blank according to claim 1, wherein the mixed region has lower abundance ratio of a microcrystalline structure made of Si-N bond compared to the high transmitting layer.

11. A phase shift mask comprising a phase shift film having a transfer pattern on a transparent substrate, wherein:
the phase shift film has a function to transmit an exposure light of an ArF excimer laser at a transmittance of 1% or more, and a function to generate a phase difference of 150 degrees or more and 200 degrees or less between the exposure light transmitted through the phase shift film and the exposure light transmitted through air for a same distance as a thickness of the phase shift film,
the phase shift film has a structure where a high transmitting layer and a low transmitting layer are stacked alternately to form a total of six or more layers,
the high transmitting layer and the low transmitting layer are made of a material consisting essentially of silicon and nitrogen, or a material consisting essentially of silicon, nitrogen, and one or more elements selected from boron, germanium, antimony, tellurium, carbon, oxygen, phosphorus, sulfur, selenium, halogen, and noble gas,
the high transmitting layer comprises 50 atom % or more nitrogen content and has a thickness of 11 nm or less, and
the low transmitting layer comprises less than 50 atom % nitrogen content and has a thickness less than the high transmitting layer, and
a mixed region including a mixture of constituent elements of the low transmitting layer and constituent elements of the high transmitting layer is formed between the low transmitting layer and the high transmitting layer.

12. The phase shift mask according to claim 11, wherein the high transmitting layer and the low transmitting layer made of same constituent elements.

13. The phase shift mask according to claim 11, wherein the high transmitting layer and the low transmitting layer are made of a material consisting essentially of silicon and nitrogen.

14. The phase shift mask according to claim 11, wherein the low transmitting layer has a thickness of ½ or less than a thickness of the high transmitting layer.

15. The phase shift mask according to claim 11, wherein the stacked structure has the high transmitting layer and the low transmitting layer stacked in this order from the transparent substrate side.

16. The phase shift mask according to claim 11, wherein the phase shift film has an uppermost layer at a position that is farthest from the transparent substrate, and the upper most layer is made of a material consisting essentially of silicon, nitrogen, and oxygen, and one or more elements selected from boron, germanium, antimony, tellurium, carbon, phosphorus, sulfur, selenium, halogen and noble gas.

17. The phase shift mask according to claim 11 comprising a light shielding film having a pattern comprising a light shielding band on the phase shift film.

18. The phase shift mask according to claim 11, wherein the mixed region has a thickness of 0.1 nm or more and 2 nm or less.

19. The phase shift mask according to claim 11, wherein the mixed region has higher abundance ratio of an amorphous structure of silicon compared to the high transmitting layer.

20. The phase shift mask according to claim 11, wherein the mixed region has lower abundance ratio of a microcrystalline structure made of Si-N bond compared to the high transmitting layer.

21. A method for manufacturing a phase shift mask using the mask blank according to claim 7, comprising the steps of:
   forming a transfer pattern on the light shielding film by dry etching;
   forming a transfer pattern on the phase shift film by dry etching with a light shielding film having the transfer pattern as a mask; and
   forming a pattern comprising a light shielding band on the light shielding film by dry etching with a resist film having a pattern comprising a light shielding band as a mask.

22. A method for manufacturing a semiconductor device comprising the step of exposure-transferring a transfer pattern on a resist film on a semiconductor substrate using the phase shift mask according to claim 17.

23. A method for manufacturing a semiconductor device comprising the step of exposure-transferring a transfer pattern on a resist film on a semiconductor substrate using a phase shift mask manufactured by the method for manufacturing a phase shift mask according to claim 21.

\* \* \* \* \*